United States Patent
Cranford, Jr. et al.

(10) Patent No.: US 7,893,766 B1
(45) Date of Patent: Feb. 22, 2011

(54) ADAPTIVE COMMON MODE BIAS FOR DIFFERENTIAL AMPLIFIER INPUT CIRCUITS

(75) Inventors: Hayden Clavie Cranford, Jr., Cary, NC (US); Todd Morgan Rasmus, Cary, NC (US); Joseph Marsh Stevens, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/557,139

(22) Filed: Sep. 10, 2009

(51) Int. Cl.
*H03F 3/45* (2006.01)

(52) U.S. Cl. ........................ 330/258; 330/261
(58) Field of Classification Search ............... 330/258, 330/252, 261
See application file for complete search history.

(56) References Cited

U.S. PATENT DOCUMENTS

| | | | |
|---|---|---|---|
| 6,275,094 B1 | 8/2001 | Cranford, Jr. et al. | |
| 6,472,939 B2 * | 10/2002 | Forbes | 330/253 |
| 6,509,795 B1 * | 1/2003 | Ivanov | 330/253 |
| 6,590,980 B1 * | 7/2003 | Moraveji | 380/255 |
| 6,642,789 B2 * | 11/2003 | Ivanov et al. | 330/253 |
| 7,579,905 B2 * | 8/2009 | Wu | 327/563 |
| 7,714,653 B2 * | 5/2010 | Tsuchiya et al. | 330/253 |
| 2006/0066393 A1 | 3/2006 | Davis et al. | |
| 2007/0132500 A1 | 6/2007 | Embabi et al. | |
| 2008/0191802 A1 | 8/2008 | Kinget | |

OTHER PUBLICATIONS

Adachi et al., "0.9-V Rail-to-Rail Operational Amplifiers with Adaptive Threshold Voltage Control", 2006 Symposium on VLSI Circuits Digest of Technical Papers, IEEE, pp. 1-2.
Haga et al., "Design of a 0.8 Volt Fully differential CMOS OTA Using the Bulk-Driven Technique", 2005 IEEE, pp. 1-4.
Solomon, "MESFET Substrate Bias Controller", IBM Technical Disclosure Bulletin, Mar. 1, 1984, pp. 5519-5521.

* cited by examiner

*Primary Examiner*—Henry K Choe
(74) *Attorney, Agent, or Firm*—Yee & Associates, P.C.; Ian D. MacKinnon (57) ABSTRACT

A method and apparatus for extending the common mode range of a differential amplifier. A circuit has a common mode detection circuit, a common mode voltage inversion circuit, and a differential amplifier. The common mode detection circuit receives a differential signal and detects a common mode voltage. The common mode voltage inversion circuit is coupled to the common mode detection circuit. The common mode voltage inversion circuit has an input node that receives the common mode voltage and an output node that outputs body voltage, wherein the common mode voltage inversion circuit creates an inverse relationship between the common mode voltage and the body voltage. The differential amplifier includes a differential pair of transistors that have a pair of body terminals coupled to the output node of the common mode voltage inversion circuit.

20 Claims, 5 Drawing Sheets

FIG. 10

ADAPTIVE COMMON MODE BIAS FOR DIFFERENTIAL AMPLIFIER INPUT CIRCUITS

BACKGROUND

1. Field

The disclosure relates generally to differential amplifiers and, more specifically, to body biasing circuitry for differential amplifiers.

2. Description of the Related Art

As the demand for bandwidth and gain requirements in serial link receivers increases, complex problems continue to rise to the forefront. For example, input signals of varying ranges often lead to non-linear operation of differential amplifier stages. These non-linear responses are caused by limited common mode range of the differential amplifier. Design engineers continually seek to solve problems relating to common mode range of their devices.

In a differential amplifier, the input common mode range refers to the range of differential input signals over which a differential amplifier maintains a linear response, including differential gain. In its simplest form, a differential amplifier has a pair of differential input transistors that receive a differential signal. Differential input signals have a common mode voltage that is the average of the differential voltage input signal received by the pair of transistors. Certain applications require a high common mode range. As common mode requirements go to extreme highs and lows, as compared to the power supply of the amplifier, biasing problems associated with the differential input transistors and current sources of the amplifier arise. These biasing problems lead to non-linear responses and inaccurate differential gain outputs of the differential amplifier.

To solve the problem of lack of input common mode range, stages have often been added to amplifiers to shift the common mode range. One example of an added stage is an active level shifter. However, adding additional circuitry causes processing speed to decrease and the size of the devices to increase. Processing speed decreasing with device size increasing creates an even greater problem for applications having increased bandwidth and gain requirements. Further, level shifting does not extend common mode range. Level shifting only shifts a default common mode range to a desired level. Ultimately, design engineers have generally had to live with the common mode range present in the devices.

Therefore, it would be advantageous to provide transistor biasing circuitry that can extend the input common mode range.

SUMMARY

The illustrative embodiments provide a method and apparatus for extending common mode range. A circuit has a common mode detection circuit, a common mode voltage inversion circuit, and a differential amplifier. The common mode detection circuit receives a differential signal and detects a common mode voltage. The common mode voltage inversion circuit is coupled to the common mode detection circuit. The common mode voltage inversion circuit has an input node that receives the common mode voltage and an output node that outputs body voltage, wherein the common mode voltage inversion circuit creates an inverse relationship between the common mode voltage and the body voltage. The differential amplifier includes a differential pair of transistors that have a pair of body terminals coupled to the output node of the common mode voltage inversion circuit, wherein coupling the pair of body terminals to the output node of the common mode voltage inversion circuit extends a common mode range of the differential amplifier.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DETAILED DESCRIPTION

Figure 1:
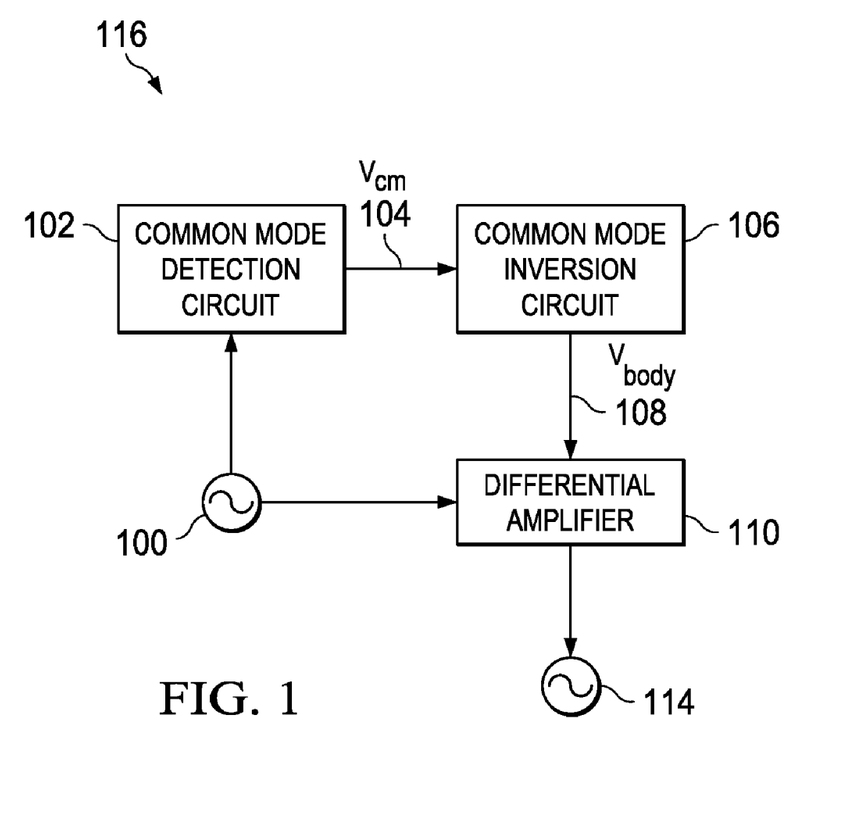
FIG. 1 is a block diagram illustrating a circuit system in accordance with an illustrative embodiment.

With reference now to the figures, and particularly with reference to FIG. 1, a block diagram of circuit system 116 is depicted in accordance with an illustrative embodiment. Differential signal 100 is received by both common mode detection circuit 102 and differential amplifier 110. Common mode detection circuit 102 monitors differential signal 100 to determine common mode voltage 104 of differential signal 100. Common mode voltage 104 passes through common mode inversion circuit 106 creating body voltage 108. Body voltage 108 bears an inverse relationship to common mode voltage 104, thereby extending the common mode range of differential amplifier 110. Differential amplifier 110 produces output signal 114. While circuit system 116 is comprised of common mode detection circuit 102, common mode inversion circuit 106, and differential amplifier 110 in this illustrative embodiment, additional circuitry may be added to circuit system 116.

Figure 2:
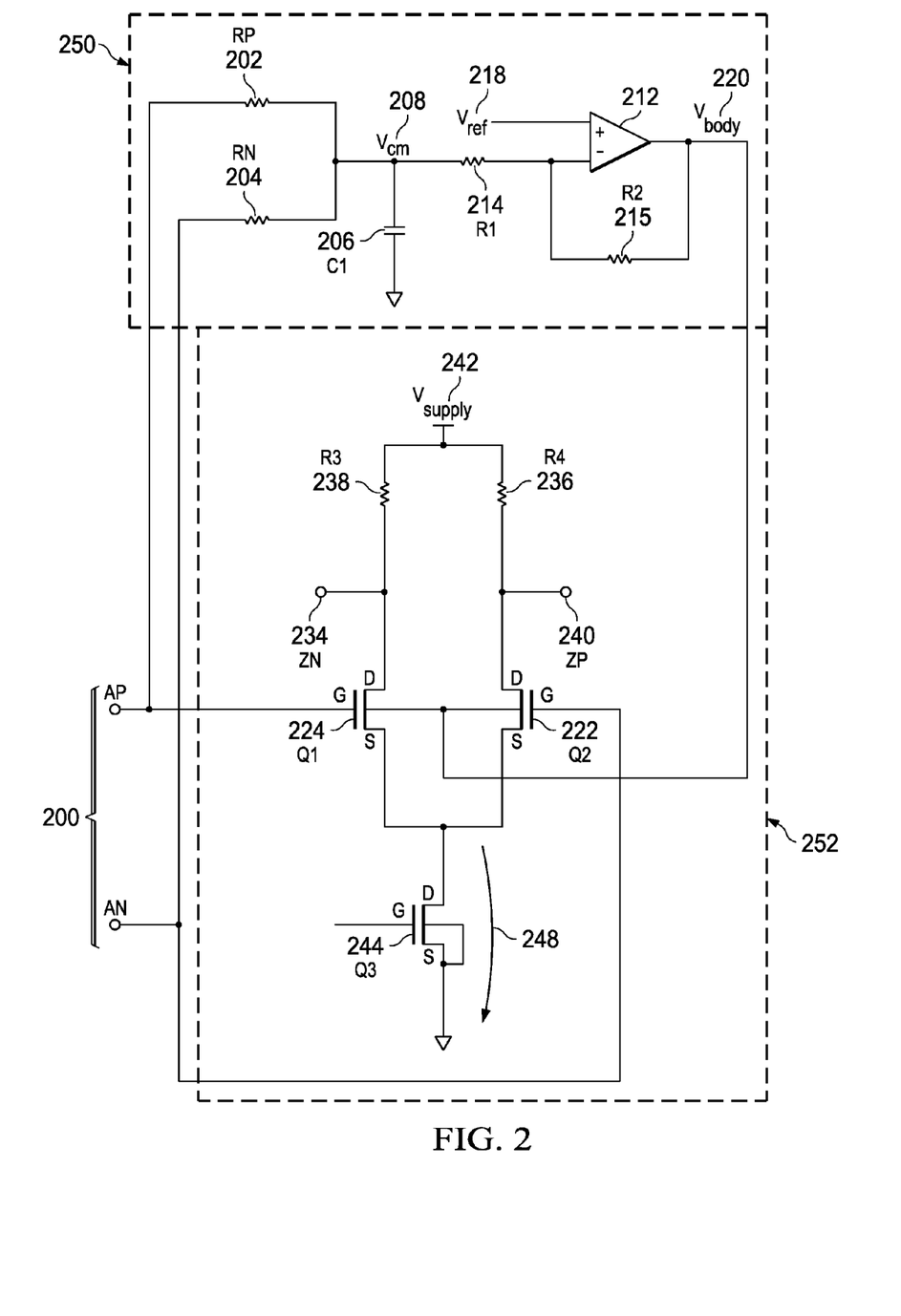
FIG. 2 is a circuit diagram illustrating a body biasing circuit in connection with a differential amplifier in accordance with an illustrative embodiment.

Turning now to FIG. 2, a circuit diagram illustrating a body biasing circuit connected with a differential amplifier is depicted in accordance with an illustrative embodiment. Differential amplifier 252 includes input transistors 222 and 224.

In this example, input transistors 222 and 224 are n-type metal-oxide semiconductor (NMOS) field effect transistors. Input transistors 222 and 224 have their gate terminals connected to receive differential signal 200 and their source terminals tied to the drain terminal of transistor 244. Tail current 248 passes through transistor 244. The body terminals of input transistors 222 and 224 are tied together and connected to the output of operational amplifier 212 represented by body voltage 220. Differential amplifier 252 further includes supply voltage 242 ($V_{supply}$), load resistors 236 and 238, and output nodes 240 and 234 over which an output signal, such as output signal 114 in FIG. 1, is produced. While NMOS transistors are used in this example, PMOS transistors may also be used as input transistors for differential amplifier 252.

Input transistors 222 and 224 are input devices of differential amplifier 252, and are critical to the common mode range and linear performance of differential amplifier 252. Input transistors 222 and 224 need to stay biased and remain in saturation mode for linear response of differential amplifier 252. The greater the range of input voltage signals that both input transistors 222 and 224 stay in saturation mode, the greater the common mode range of differential amplifier 252. Saturation mode biasing of an NMOS transistor is determined by the voltage drop from the drain to the source of the transistor ($V_{DS}$) staying higher than the voltage drop from the gate to the source minus the threshold voltage ($V_{TH}$). For high common mode voltage ranges, differential amplifier 252 is biased better with a higher threshold voltage. For low common mode voltage ranges, differential amplifier 252 is biased better with lower threshold voltage.

The threshold voltage ($V_{TH}$) of an NMOS transistor can be adjusted by the body effects of the transistor. The voltage drop from the body terminal of a transistor to the source terminal of the transistor ($V_{BS}$) bears an inverse relationship to the threshold voltage of the transistor. Thus, as $V_{BS}$ decreases, $V_{TH}$ increases, and vice versa.

The body effect is used to extend the common mode range in this illustrative example. In this embodiment, body biasing circuit 250 is used to manipulate the $V_{BS}$ of input transistors 222 and 224. Body biasing circuit 250 includes resistors 202 and 204 which receive differential signal 200 and connect to a common node with capacitor 206 to form a detection circuit, such as common mode detection circuit 102 in FIG. 1. Common mode voltage 208 ($V_{cm}$) is detected as differential signal 200 is filtered by resistors 202 and 204 and capacitor 206. Common mode voltage 208 passes through operational amplifier 212 to produce body voltage 220 ($V_{body}$). Resistors 214 and 215 alter the response of operational amplifier 212 into that of an inverting amplifier. Thus, body voltage 220 bears an inverse relationship to common mode voltage 208. Body voltage 220 is connected to the body terminals of input transistors 222 and 224 and bears a direct relationship to $V_{bs}$. Consequently, when body voltage 220 is created by inverting common mode voltage 208 and connected to the body terminals, $V_{cm}$ and $V_{TH}$ bear a direct relationship. In other words, the threshold voltage will move up with high common mode and down with low common mode. This direct relationship between threshold voltage and common mode voltage allows input transistors 222 and 224 to remain biased in saturation mode over a greater range of common mode voltage input, thus producing a wider common mode range for the differential amplifier. While body biasing circuit 250 and differential amplifier 252 are depicted in FIG. 2 as an example of circuitry used in circuit system 116 in FIG. 1, additional circuitry may be added to circuit system 116 without departing from the scope of the present invention.

Further, the circuitry of this illustrative embodiment may be optimized for a range of common mode voltages detected. Gain parameters for operational amplifier 212 are controlled by input resistor 214 (R1), feedback resistor 215 (R2), and reference voltage 218 ($V_{ref}$). Adjusting the parameters of these components may alter the relationship between body voltage 220 and common mode voltage 208, allowing for a sharper or flatter response to changes in common mode voltage ranges detected. Adjustable responses to changes in common mode voltage ranges detected allows the circuitry to be tuned for different body effect parameters and create desired differential amplifier performance.

The inverting amplifier formed from resistors 214, 215, and operational amplifier 212 is used as an example of a circuit, such as common mode inversion circuit 106 in FIG. 1, to create the inverse relationship between common mode voltage 208 and body voltage 220. Other types of inversion circuitry may be used to create this relationship, such as, for example, a common source amplifier, inverter, or comparator.

Figure 3:
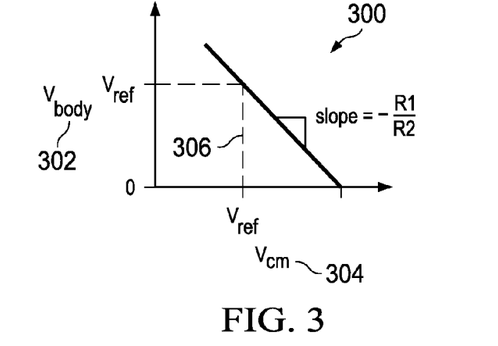
FIG. 3 is a graph illustrating a relationship between body voltage and the common mode voltage of the circuitry in accordance with an illustrative embodiment.

Turning now to FIGS. 3-6, graphs illustrating voltage relationships between various nodes of the circuitry are depicted in accordance with an illustrative embodiment. Graph 300 in FIG. 3 shows the inverse relationship between body voltage 302 and common mode voltage 304 for a reference voltage 306 ($V_{ref}$). This inverse relationship can be created by passing common mode voltage 304 through common mode inversion circuitry, such as operational amplifier 212 in FIG. 2. Common mode voltage 304 can be a common mode detected from an input differential signal, such as common mode voltage 208 detected from differential signal 200 in FIG. 2. This inverse relationship is represented by the following body to common mode equation:

$$V_{body} = \left(\frac{R2}{R1} + 1\right) * V_{ref} - \frac{R2}{R1} * V_{cm}$$

with the slope of the inverse relationship being equal to $-R2/R1$ for reference voltage 306.

Figure 4:
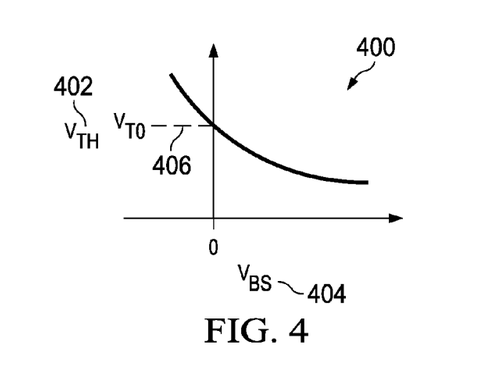
FIG. 4 is a graph illustrating a relationship between threshold voltage and body-to-source voltage of the circuitry in accordance with an illustrative embodiment.

Graph 400 in FIG. 4 shows the body effect between threshold voltage 402 and body-to-source voltage 404 for an NMOS transistor, such as input transistors 222 and 224 in FIG. 2. The body effect creates an inverse relationship as well. Therefore, as body-to-source voltage 404 of a transistor increases, threshold voltage 402 decreases exponentially. This body effect is represented by the following body effect equation:

$$V_{TH} = V_{T0} + \gamma(\sqrt{\phi - V_{BS}} - \sqrt{\phi})$$

where $V_{T0}$ 406 is threshold voltage for $V_{BS}=0$, $\gamma$ is the body effect parameter, and $\phi$ is the surface potential of the transistor.

Figure 5:
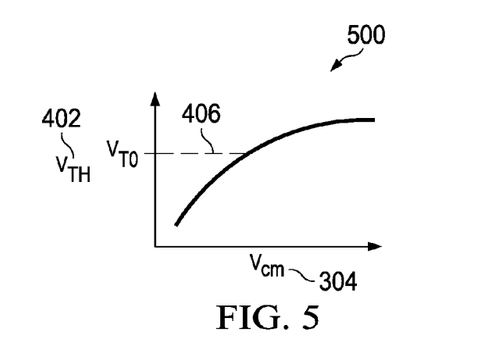
FIG. 5 is a graph illustrating a relationship between threshold voltage and common mode voltage of the circuitry in accordance with an illustrative embodiment.

Graph 500 in FIG. 5 shows the direct relationship between threshold voltage 402 and common mode voltage 304 for a transistor, such as input transistors 224 and 222 in FIG. 2. Thus, as the common mode voltage 304 increases, the threshold voltage 402 of a transistor is increased and the common mode range of the transistor is increased. These relationships are represented by the following equation:

$$V_{TH} \approx V_{T0} + \gamma(\sqrt{\phi - V_{body} + V_{cm} - V_{GS}} - \sqrt{\phi})$$

which is the body effect equation substituting common mode voltage 304 for body-to-source voltage 404 where $V_{GS}$ is the gate-to-source voltage of a transistor which is equal to common mode voltage 304 minus the source voltage for a transistor in circuitry in accordance with an illustrative embodiment, such as input transistors 224 and 222 in FIG. 2. Next, placing the previous equation in terms of R1, R2 and $V_{ref}$, such as those of body biasing circuit 250 in FIG. 2, result in the following equation:

$$V_{TH} \cong V_{TO} + \gamma\left(\sqrt{\varphi + \left(\frac{R2}{R1} + 1\right)*(V_{cm} - V_{ref}) - V_{GS}} - \sqrt{\varphi}\right)$$

This equation further provides for control over optimization of the circuitry such as the gain parameters described above. These equations are approximate because they ignore the slight effects of $V_{GS}$ dependence on $V_{TH}$.

Figure 6:
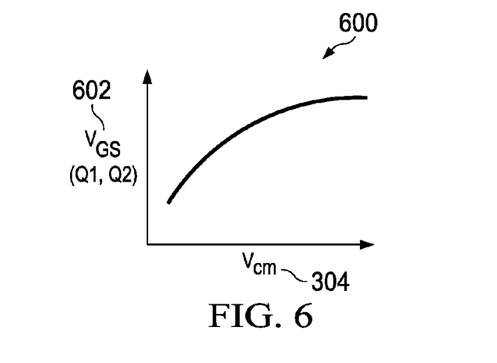
FIG. 6 is a graph illustrating a relationship between gate-to-source voltage and common mode voltage of the circuitry in accordance with an illustrative embodiment.

Graph 600 in FIG. 6 shows the direct relationship between gate-to-source voltage 602 and common mode voltage 304 for transistors, such as input transistors 224 and 222 in FIG. 2, for a constant drain-to-source current. This direct relationship is represented by the following equations:

$$I_{DS} \cong \frac{\beta}{2}*(V_{GS} - V_{TH})^2; \quad \text{and} \quad V_{GS} \cong \frac{2*\sqrt{I_{DS}}}{\beta} + V_{TH}$$

where $V_{DS}$ represents the drain-to-source current across the transistors and β is a process parameter. As threshold voltage 402 increases with increasing input common mode voltage 304, as shown in FIG. 5, the gate-to-source voltage 602 increases. Increasing the gate-to-source voltage 602 improves the biasing of the input transistors, such as input transistors 224 and 222 in FIG. 2, at high common mode because the drain-to-source voltage is increased. Conversely, at lower common mode voltage 304, threshold voltage 402 decreases which decreases gate-to-source voltage 602 of input transistors 224 and 222. Decreasing gate-to-source voltage 602 improves the biasing of the current source, such as transistor 244 in FIG. 2, at low common mode because the drain-to-source voltage of the current source is increased. These equations are also approximate because they ignore the slight effects of $V_{GS}$ dependence on $V_{TH}$.

Figure 7:
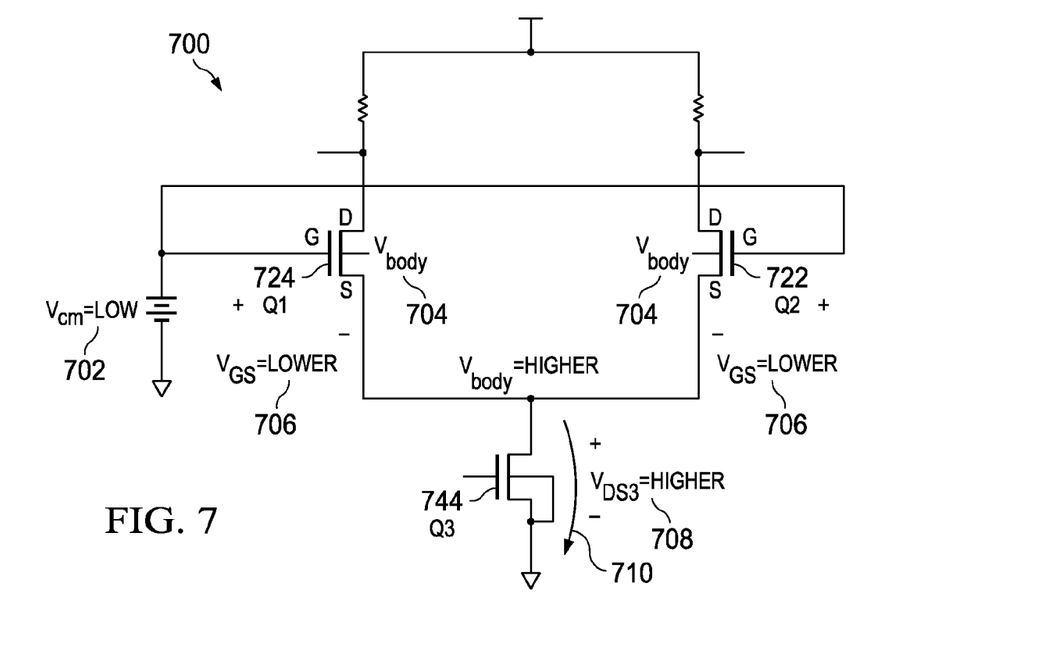
FIG. 7 is a circuit diagram illustrating behavior of a differential amplifier for a given low common mode voltage in accordance with an illustrative embodiment.
Figure 8:
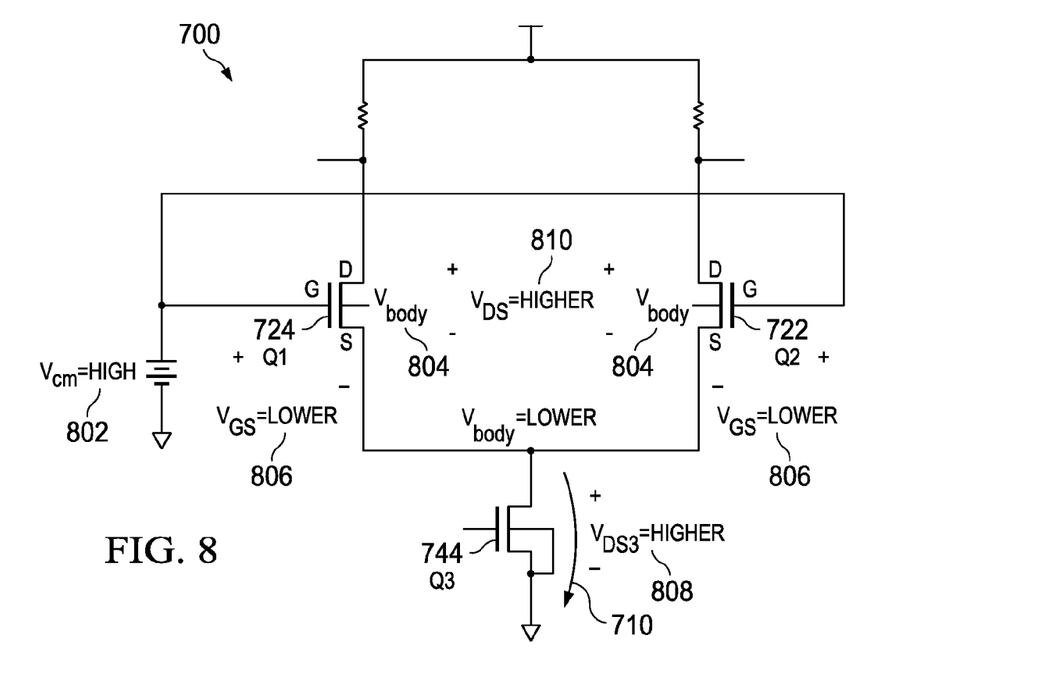
FIG. 8 is a circuit diagram illustrating behavior of a differential amplifier for a given high common mode voltage in accordance with an illustrative embodiment.

Turning now to FIGS. 7 and 8, circuit diagrams illustrating behavior of a differential amplifier for different given common mode voltages are depicted in accordance with an illustrative embodiment. The circuit diagrams illustrate differential amplifier 700 performing at low common mode in FIG. 7 and at high common mode in FIG. 8. Low common mode 702 in FIG. 7 and high common mode 802 in FIG. 8 symbolize the common mode voltage of the differential signal input.

When the common mode input is low (low common mode 702), body voltage 704 rises due to the inverse relationship created, such as by body biasing circuit 250 in FIG. 2. The body effect, represented by the body effect equation, lowers the threshold voltage of transistors 722 and 724. Lowering the threshold voltage lowers the gate-to-source voltage 706. The lowered gate-to-source voltage 706 results from the direct relationship created with common mode voltage, such as illustrated by graph 600 in FIG. 6. Lower gate-to-source voltage 706 allows for a higher drain-to-source voltage 708 ($V_{DS3}$) across transistor 744. Transistor 744 acts as a current source for differential amplifier 700, with tail current 710 representing the current. Higher drain-to-source voltage 708 across transistor 744 allows it to remain biased in saturation mode despite low common mode 702 input. The bias of transistor 744 in saturation mode allows differential amplifier 700 to perform properly at low common mode 702, thereby extending the common mode range of differential amplifier 700 for low common mode voltage ranges.

When the common mode input is high (high common mode 802) the inverse relationship created lowers body voltage 804, such as by body biasing circuit 250 in FIG. 2. The body effect, represented by the body effect equation, raises the threshold voltage of transistors 722 and 724. Raising the threshold voltage allows transistors 722 and 724 to stay biased and remain in saturation mode for the higher range of common mode voltages detected. The gate-to-source voltage 806 rises as a result of the direct relationship created with common mode voltage, as illustrated by graph 600 in FIG. 6. Raising gate-to-source voltage 806 lowers drain-to-source voltage 808 across transistor 744. The lower drain-to-source voltage 808 increases drain-to-source voltage 804 of transistors 722 and 724, keeping them biased in saturation mode. Because they stay biased in saturation mode, the small signal gain of transistors 722 and 724 remains relatively constant. Higher gate-to-source source voltage 806 lowers drain-to-source voltage 808 across transistor 744. At high common mode 802, bias of transistor 744 is not much of an issue as drain-to-source voltage 808 is generally high for high common mode 802. Lowering drain-to-source voltage 808 allows for higher drain-to-source voltage 804 across transistors 722 and 724. Due to the higher drain-to-source voltage 810 across transistors 722 and 724 allows transistors 722 and 724 to remain biased in saturation mode for high common mode 802 and the gain performance of differential amplifier 700 increases.

Figure 9:
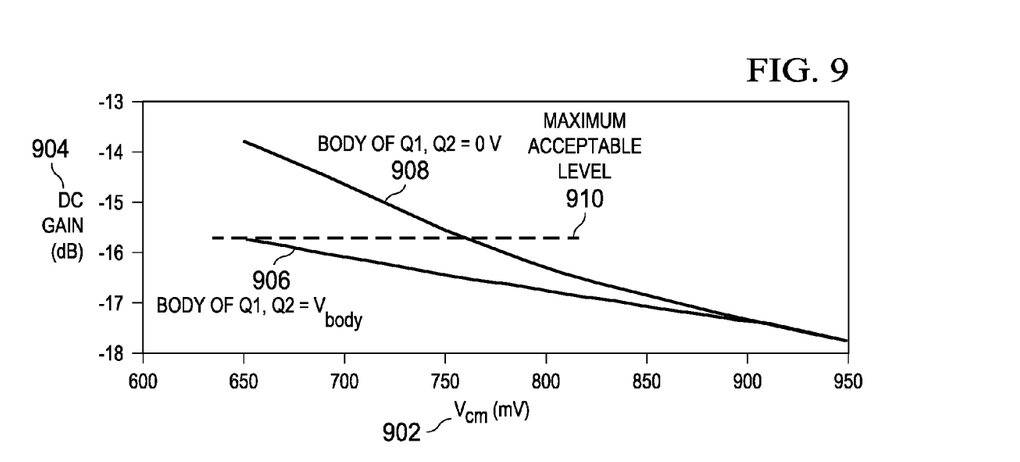
FIG. 9 is a graph depicting simulation results for increased common mode range at low common mode in accordance with an illustrative embodiment.
Figure 10:
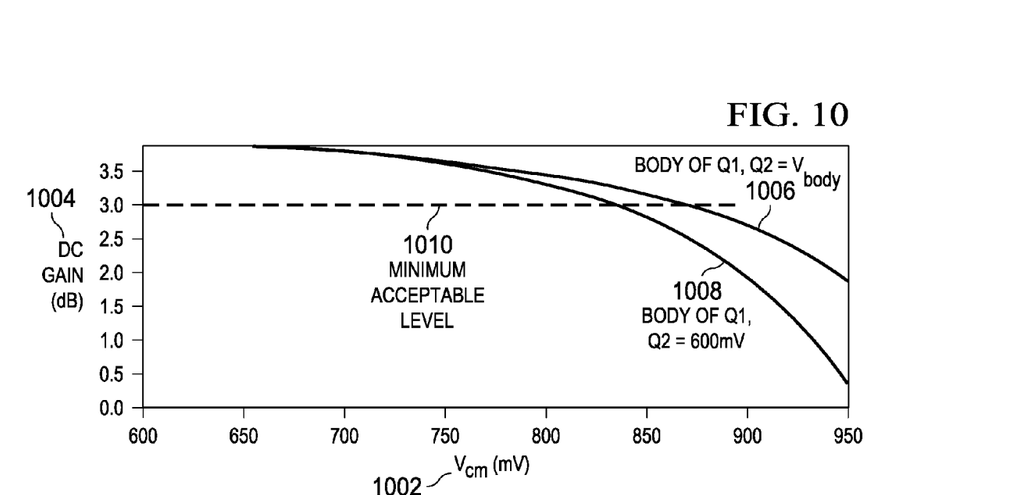
FIG. 10 is a graph depicting simulation results for increased common mode range at high common mode in accordance with an illustrative embodiment.

Turning now to FIGS. 9 and 10, graphs illustrating simulation results for increased common mode range for given common mode voltages are depicted in accordance with an illustrative embodiment. FIG. 9 shows the DC gain 904 for common mode voltage 902 of signals 906 and 908 at low common mode. Signal 906 illustrates a graph of a signal from a differential amplifier with body terminals connected to a body biasing circuit, such as illustrated by FIG. 2. Signal 908 illustrates a signal from a differential amplifier that does not use a body biasing circuit. Rather, the body terminal is tied to ground, as commonly used in high common mode differential amplifier settings. For an application having maximum acceptable level of DC gain 910, the increase of the common mode range detected during the simulation at low common mode is over 50%. Likewise, FIG. 10 shows the DC gain 1004 for common mode voltage 1002 of signals 1006 and 1008 at high common mode. Signal 1006 illustrates a graph of a signal from a differential amplifier with body terminals connected to a body biasing circuit, such as illustrated by FIG. 2. Signal 1008 illustrates a signal form a differential amplifier that does not use a body biasing circuit. Rather, the body terminal is set to 600 mV, as commonly used in low common mode differential amplifier settings. For an application having minimum acceptable level of DC gain 1010, the increase of the common mode range detected during the simulation at high common mode is over 25%.

There are several additional benefits to the described embodiments of the invention besides extending the common mode range of the differential amplifier. The differential amplifier performance improves because the input devices and current source devices are biased in a more ideal location. Thus, the DC gain accuracy of the amplifier improves, the AC response is flatter, and the jitter performance is improved. The common mode rejection of the differential amplifier is also improved because the current source impedance is higher with better saturation mode biasing across the input common mode range. There is an additional benefit to increasing the current source impedance from this body biasing approach. If source degeneration is implemented in the differential amplifier, the resulting DC gain of the differential amplifier is more accurate. This is especially true at very low DC gain applications where the source degeneration resistance is very high.

The circuit, as described above, is part of the design for an integrated circuit chip. The chip design is created in a graphical computer programming language and stored in a computer storage medium (such as a disk, tape, physical hard drive, or virtual hard drive, such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and it is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit comprising:
    a common mode detection circuit for receiving a differential signal and detecting a common mode voltage;
    a common mode voltage inversion circuit coupled to the common mode detection circuit, the common mode voltage inversion circuit having an input node for receiving the common mode voltage and an output node for outputting a body voltage, wherein the common mode voltage inversion circuit creates an inverse relationship between the common mode voltage and the body voltage; and
    a differential amplifier including a differential pair of transistors having a pair of body terminals coupled to the output node of the common mode voltage inversion circuit.

2. The circuit of claim 1, wherein the common mode detection circuit comprises a pair of parallel resistors and a filtering capacitor for detecting the common mode voltage of the differential signal received.

3. The circuit of claim 2, wherein the common mode voltage inverting circuit comprises:
    an input resistor having an input resistance coupled to the input node;
    a feedback resistor having a feedback resistance coupled between the input resistor and the output node; and
    a reference voltage.

4. The circuit of claim 3, wherein the input resistance, the feedback resistance, and the reference voltage are adjusted based upon the common mode voltage detected by the pair of parallel resistors to create a desired inverse relationship between the common mode voltage and the body voltage.

5. The circuit of claim 4, further comprising:
    wherein the differential pair of transistors requires a threshold voltage to operate in a saturation mode;
    wherein the body voltage adjusts the threshold voltage of the differential pair of transistors;
    wherein the differential amplifier receives the differential signal; and
    wherein the desired inverse relationship between the common mode voltage and the body voltage allows the differential pair of transistors to operate in the saturation mode for the common mode voltage detected of the differential signal received.

6. The circuit of claim 5, wherein the differential pair of transistors operating in the saturation mode for a given range of voltages detected by the common mode detection circuit extends a common mode range of the differential amplifier.

7. The circuit of claim 3, wherein passing the common mode voltage through an inverting operational amplifier creates the inverse relationship between the common mode voltage and the body voltage.

8. The circuit of claim 7, wherein the differential amplifier is a variable gain amplifier for receiving the differential signal and outputting an increased or decreased voltage signal.

9. A method for extending a common mode range of a differential amplifier, the method comprising:
    receiving a differential signal at a common mode detection circuit;
    outputting a common mode voltage from the common mode detection circuit;
    receiving the common mode voltage at an input node of a common mode voltage inversion circuit coupled to the common mode detection circuit;
    outputting a body voltage at an output node of the common mode voltage inversion circuit, wherein the common mode voltage inversion circuit creates an inverse relationship between the common mode voltage and the body voltage; and
    coupling the output node of the common mode voltage inversion circuit to a pair of body terminals of a differential pair of transistors of the differential amplifier.

10. The method of claim 9, wherein the common mode detection circuit comprises a pair of parallel resistors and a filtering capacitor, the method further comprising:
    detecting, by the pair of parallel resistors and the filtering capacitor, the common mode voltage of the differential signal received.

11. The method of claim 10, wherein the common mode voltage inverting circuit comprises an input resistor having an input resistance, a feedback resistor having a feedback resistance, and a reference voltage; the method further comprising:
    coupling the input resistor to the input node; and
    coupling the feedback resistor between the input resistor and the output node.

12. The method of claim 11, further comprising:
    adjusting the input resistance, the feedback resistance, and the reference voltage based upon the common mode voltage detected by the pair of parallel resistors to create a desired inverse relationship between the common mode voltage and the body voltage.

13. The method of claim 12, further comprising:
    requiring a threshold voltage of the differential pair of transistors for the differential pair of transistors to operate in a saturation mode;
    adjusting the threshold voltage of the differential pair of transistors by the body voltage;
    receiving the differential signal by the differential amplifier; and
    operating, by the differential pair of transistors, in the saturation mode for the common mode voltage detected of the differential signal received, wherein the desired inverse relationship between the common mode voltage and the body voltage allows operation in the saturation mode for the common mode voltage detected.

14. The method of claim 13, further comprising:
extending a common mode range of the differential amplifier by the differential pair of transistors operating in the saturation mode for a given range of voltages detected by the common mode detection circuit.

15. The method of claim 10, wherein passing the common mode voltage through an inverting operational amplifier creates the inverse relationship between the common mode voltage and the body voltage-.

16. The method of claim 15, wherein the differential amplifier is a variable gain amplifier for receiving the differential signal and outputting an increased or decreased voltage signal.

17. An apparatus for receiving a differential signal, the apparatus comprising:
a pair of parallel resistors and a filtering capacitor for receiving the differential signal and detecting a common mode voltage;
an inverting operational amplifier having an input resistor, a feedback resistor, and a reference voltage, the inverting operational amplifier for receiving the common mode voltage and outputting a body voltage, wherein the common mode voltage has an inverse relationship to the body voltage and wherein the inverse relationship is controlled based upon a set of values for the input resistor, the feedback resistor, and the reference voltage;
a differential amplifier including a differential pair of transistors having a pair of body terminals, wherein the pair of body terminals are coupled to an output node of the inverting operational amplifier to receive the body voltage.

18. The apparatus of claim 17, further comprising:
wherein the differential pair of transistors requires a threshold voltage to operate in a saturation mode;
wherein the body voltage adjusts the threshold voltage of the differential pair of transistors is adjusted by;
wherein the differential amplifier receives the differential signal;
wherein the inverse relationship between the common mode voltage and the body voltage allows the differential pair of transistors to operate in the saturation mode for the common mode voltage detected of the differential signal received;
wherein the differential pair of transistors operating in the saturation mode for a given range of voltages detected extends a common mode range of the apparatus; and
wherein the differential amplifier is a variable gain amplifier for receiving the differential signal and outputting an increased or decreased voltage signal.

19. The apparatus of claim 17, further comprising:
a current source of the differential amplifier, the current source including a tail transistor having a drain terminal, the drain terminal coupled to source terminals of the differential pair of transistors, wherein responsive to detecting a low common mode voltage of the differential signal, the inverse relationship between the common mode voltage and the body voltage raises a drain-to-source voltage of the tail transistor.

20. The apparatus of claim 17, further comprising:
a current source of the differential amplifier, the current source including a tail transistor having a drain terminal, the drain terminal coupled to source terminals of the differential pair of transistors, wherein responsive to detecting a high common mode voltage of the differential signal, the inverse relationship between the common mode voltage and the body voltage lowers a drain-to-source voltage of the tail transistor.

\* \* \* \* \*